United States Patent
Eymery et al.

(10) Patent No.: US 10,112,828 B2
(45) Date of Patent: Oct. 30, 2018

(54) METHOD FOR HOMOGENIZING THE HEIGHT OF A PLURALITY OF WIRES AND DEVICE USING SUCH WIRES

(71) Applicant: COMMISSARIAT A L'ENERGIE ATOMIQUE ET AUX ENERGIES ALTERNATIVES, Paris (FR)

(72) Inventors: Joël Eymery, Sassenage (FR); Amine El Kacimi, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/637,336

(22) Filed: Jun. 29, 2017

(65) Prior Publication Data

US 2018/0002169 A1   Jan. 4, 2018

(30) Foreign Application Priority Data

Jun. 29, 2016 (FR) ...................... 16 56088

(51) Int. Cl.
*H01L 33/06* (2010.01)
*B82B 3/00* (2006.01)
*G01L 1/16* (2006.01)
*G01L 9/08* (2006.01)
*H01L 33/08* (2010.01)
(Continued)

(52) U.S. Cl.
CPC .......... *B82B 3/0038* (2013.01); *C01B 32/168* (2017.08); *G01L 1/16* (2013.01); *G01L 9/08* (2013.01); *H01L 33/06* (2013.01); *H01L 33/08* (2013.01); *B82Y 10/00* (2013.01);
(Continued)

(58) Field of Classification Search
CPC .......... H01L 29/0676; H01L 21/02603; H01L 21/02639
See application file for complete search history.

(56) References Cited

U.S. PATENT DOCUMENTS 6,286,226 B1 * 9/2001 Jin ...................... H01H 1/0094
200/61.41
8,617,407 B2 * 12/2013 Hantschel .............. B82Y 10/00
216/11
(Continued)

FOREIGN PATENT DOCUMENTS

EP    1 087 413 A2    3/2001

OTHER PUBLICATIONS

Search Report as issued in French Patent Application No. 1656088, dated Feb. 20, 2017.

*Primary Examiner* — Jaehwan Oh
(74) *Attorney, Agent, or Firm* — Pillsbury Winthrop Shaw Pittman LLP (57) ABSTRACT

A method for homogenizing the height of a plurality of wires from the plurality of wires erected on a face of a substrate, the method including a first step of coating the face of the substrate including the plurality of wires with a first film, the first film embedding the plurality of wires over a first height; a second step of coating the first film with a second film, the second film embedding at least one part of the plurality of wires over a second height; a step of removing the second film, the part of the wires of the plurality of wires embedded in the second film being removed at the same time as the second film, a mechanical stress between the first film and the second film being exerted during the removal step.

7 Claims, 13 Drawing Sheets

(51) Int. Cl.
   *C01B 32/168*  (2017.01)
   *B82Y 10/00*   (2011.01)
   *B82Y 40/00*   (2011.01)
   *H01L 29/06*   (2006.01)
   *H01L 29/20*   (2006.01)

(52) U.S. Cl.
   CPC .......... *B82Y 40/00* (2013.01); *H01L 29/0676* (2013.01); *H01L 29/20* (2013.01)

(56) References Cited

U.S. PATENT DOCUMENTS

| | | |
|---|---|---|
| 2003/0189202 A1 | 10/2003 | Li et al. |
| 2006/0134883 A1* | 6/2006 | Hantschel .............. B82Y 10/00 438/458 |
| 2014/0197130 A1* | 7/2014 | Lemke .................... C01B 31/02 216/13 |
| 2015/0318071 A1 | 11/2015 | Song et al. |
| 2017/0125518 A1* | 5/2017 | Oxland ............... H01L 29/0676 |
| 2017/0179281 A1* | 6/2017 | Chan ................. H01L 21/02538 |

* cited by examiner

METHOD FOR HOMOGENIZING THE HEIGHT OF A PLURALITY OF WIRES AND DEVICE USING SUCH WIRES

CROSS-REFERENCE TO RELATED APPLICATIONS

This application claims priority to French Patent Application No. 1656088, filed Jun. 29, 2016, the entire content of which is incorporated herein by reference in its entirety.

FIELD

The technical field of the invention is that of the manufacture of wires. The present invention relates to the manufacture of a plurality of wires erected on a substrate and in particular a method for homogenizing the height of a plurality of wires erected on a substrate.

BACKGROUND

Semiconductor wires are used in many applications such as LED (Light Emitting Diode) devices or even piezoelectric sensors. These wires are usually obtained by growth using different methods such as MOVPE (Metalorganic Vapour Phase Epitaxy), hydrothermal growth, MBE (Molecular Beam Epitaxy) or HVPE (Hydride Vapour Phase Epitaxy). These methods have the advantage to ensure a unidimensional structure and a very high crystal quality. However, the morphology of the wires, and in particular their height, is not always controlled during the growth process. One solution which is contemplatable is to employ specific substrates but that supposes also a more expensive and longer manufacturing method. It is also possible to employ "planarization" methods such as chemical-mechanical polishing, but the use of such methods generates micro- or nanoscale debris which are very difficult to be withdrawn and which can disturb the operation of a device using such wires. Moreover, such chemical-mechanical methods are not compatible with the soft and flexible layers such as PDMS (polydimethylsiloxane) or parylene layers.

Thus, there is a need for a method enabling homogeneous wires to be obtained without employing specific substrates and without generating debris at the surface of the substrate.

SUMMARY

An aspect of the invention offers a solution to the problems previously discussed, by allowing a plurality of wires with homogeneous height to be obtained, from the plurality of wires erected on a substrate, using a method comprising a first step of coating with a first film of a first height, a second step of coating with a second film of a second height and a step of removing the second film. The removal of this second film is performed by exerting a mechanical stress which ruptures the wires. Thus, wires the maximum height of which is set by the first height of the first film are obtained. In addition, since the whole is embedded in the first or second layer upon rupturing, no debris are generated at the surface of the substrate.

For that, a first aspect of the invention relates to a method for homogenizing the height of a plurality of wires from the plurality of wires erected on a face of a substrate, the method comprising:

a first step of coating the face of the substrate comprising the plurality of wires with a first film, the first film embedding the plurality of wires over a first height;

a second step of coating the first film with a second film, the second film embedding at least one part of the plurality of wires over a second height;

a step of removing the second film, the part of the wires of the plurality of wires embedded in the second film being removed at the same time as the second film;

a mechanical stress between the first film and the second film being exerted during the removal step.

By wire, it is intended a solid element having a high aspect ratio along one of its dimensions, the other two dimensions being substantially of the same order of magnitude, the wire possibly being solid or hollow (for example carbon nanotubes), with a structure which is homogeneous or not (for example with a radial or longitudinal heterostructure). These wires can in particular be obtained by coating, growth, extrusion, mechanical assembly, etching or even phase separation. More generally, any method enabling an elongate structure to be obtained can be used. The wires can have a milliscale, microscale, or even nanoscale size. By milliscale (microscale/nanoscale) wires, it is intended wires at least one of the dimensions thereof is in the order of one millimeter (micrometer/nanometer). By erected, it is intended that the main axis of the wire, that is the axis parallel to the greatest dimensions of the wire, is off plane, and in an embodiment by forming with the same an angle higher than 30°, beneficially higher than 45°. In other words, the main axis of the wire and the axis normal to the surface form an angle smaller than 60°, beneficially smaller than 45°. The height of a wire is thus defined by the projection of the length of the wire onto the axis normal to the surface of the substrate. In other words, when the main axis of a wire is normal to the surface, then the length and the height of the wire are equal. Thus, when the normal axis of the wires of the plurality of wires is normal to the surface of the substrate, the method for homogenizing the height of a plurality of wires also performs homogenizing of the length of the plurality of wires.

By method for homogenizing, it is intended a method which enables control to be exerted on the maximum height of the wires of the plurality of wires but also, when the contemplated application requires it, on the minimum height of the wires. In the latter case, as will be explained in the following, the wires of the plurality of wires have all the same height or, in other words, a perfectly homogeneous height.

By virtue of the method according to a first aspect of the invention, a plurality of wires the maximum height of which is substantially equal to the height of the first film is obtained. Indeed, the mechanical stress imposed during the removal step will break the wires at the interface between the first film and the second film. The wires thereby will be in two parts, a first part will remain in the first film and the second part will remain in the second film, the second part being thus withdrawn during the removal step. The mechanical stress can for example be exerted by performing a removal by peeling the second film. Generally, any removal technique enabling a mechanical stress to be generated can be used. As previously explained, the method according to an embodiment of the invention has also the benefit not to cause formation of debris at the surface. The post "planarization" washing step is no longer necessary. It is further compatible with the use of soft layers such as PDMS, parylene, PVN (polyvinyl nitrate) PEN (polynaphthalate) or PVDF (polyvinylidene fluoride) layers for example. In addition, the first height or the second height are parameters which are easy to control by spin coating techniques. The peeling methods are also well controlled and enable the mechanical stress necessary for rupturing the wires to be controllably exerted.

In addition to the characteristics just discussed in the previous paragraph, the method according to one aspect of the invention can have one or more complementary characteristics from the following ones, considered singly or according to any technically possible combinations.

In an embodiment, the first height is smaller than or equal to the height of the lowest wire of the plurality of wires. Thus, it is ensured that all the wires have a height lower than or equal to the height of the lowest wire.

In an embodiment, the method according to the invention comprises, between the first coating step and the second coating step, a third coating step with an anti-adhesive layer. Thus, the removal step is facilitated, the separation being generally made at the interface having the smallest binding energy, the anti-adhesive remaining sometimes partially on both surfaces.

In an embodiment, the method according to the invention comprises, after the step of removing the second film, a step of removing the anti-adhesive layer. Thus, when the step of removing the second film does not cause the full removal of the anti-adhesive layer, this step enables this layer to be suppressed.

In an embodiment, the method according to the invention comprises, after the step of removing the second film or the step of removing the anti-adhesive layer, a step of removing the substrate, the first film thus forming a membrane including a plurality of wires having a homogeneous height. Thus, a membrane including wires the height of which is homogeneous is obtained.

In an embodiment, the method according to the invention comprises, after the step of removing the second film or the step of removing the anti-adhesive layer, a step of removing the first film. Thus, a substrate including on one of these faces a plurality of wires having a homogeneous height is obtained.

A second aspect of the invention relates to a device including a plurality of wires obtained using a method according to a first aspect of the invention.

In an embodiment, the device is a sensor type or nanogenerator type piezoelectric device. Thus, a device comprising wires with a homogeneous height is obtained which ensures proper homogeneity of voltage detection or current generation.

In an embodiment, the device is an optoelectronic device, for example a light emitting device. Thus, the light emitting device obtained comprises wires with a homogeneous height which ensures proper homogeneity of the light emitted.

The invention and its different applications will be better understood upon reading the description that follows and upon examining the accompanying figures.

BRIEF DESCRIPTION OF THE FIGURES

The figures are introduced by way of indicating and in no way limiting purposes of the invention.

DETAILED DESCRIPTION

Unless otherwise stated, a same element appearing on different figures has a single reference.

A first embodiment of a method for homogenizing the height of a plurality of wires 2 according to a first aspect of the invention is illustrated in FIGS. 1 and 2A to 2E. In this embodiment, there is first a substrate 1 including the plurality of wires 2 erected on one of its faces. Besides, the method comprises:

a first step E1 of coating (illustrated in FIG. 2B) the face of the substrate 1 comprising the plurality of wires 2 with a first film 3, the first film 3 embedding the plurality of wires 2 over a first height h1;

a second step E2 of coating (illustrated in FIG. 2C) the first film 3 with a second film 4, the second film 4 embedding at least one part of the plurality of wires 2 over a second height h2;

a step E3 of removing (illustrated in FIG. 2D) the second film 4, the part of the wires 2 of the plurality of wires 2 which is embedded in the second film 4 being removed at the same time as the second film 4.

Figure 1:
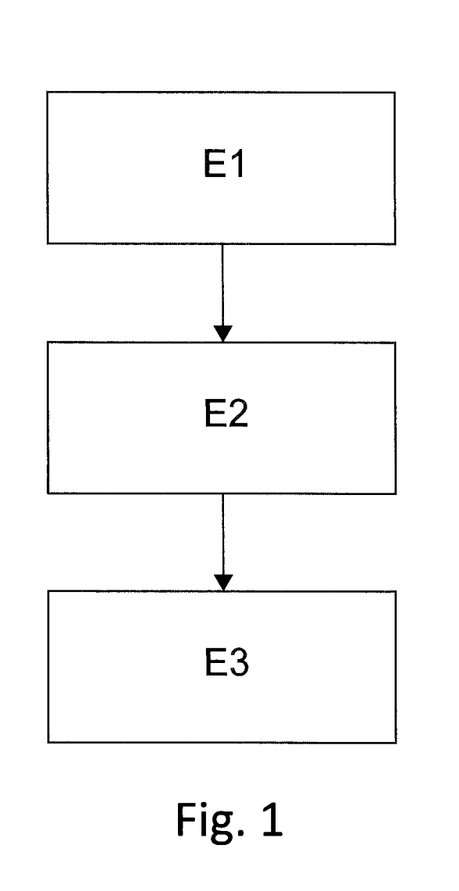
FIG. 1 shows a flowchart of a first embodiment of a method according to a first aspect of the invention.
Figure 2A:
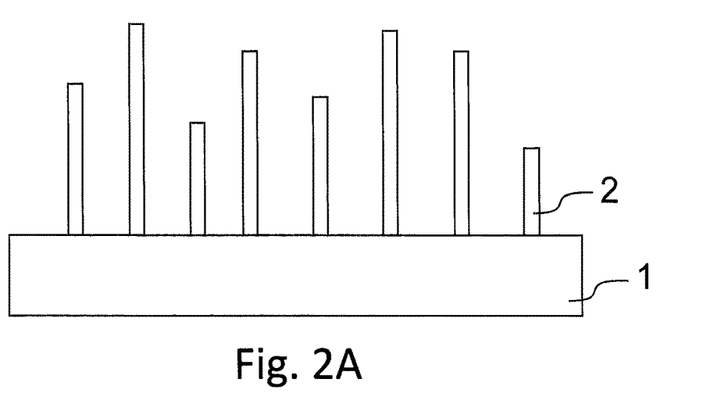
FIGS. 2A to 2E show the different steps of the first embodiment of a method according to a first aspect of the invention.
Figure 2B:
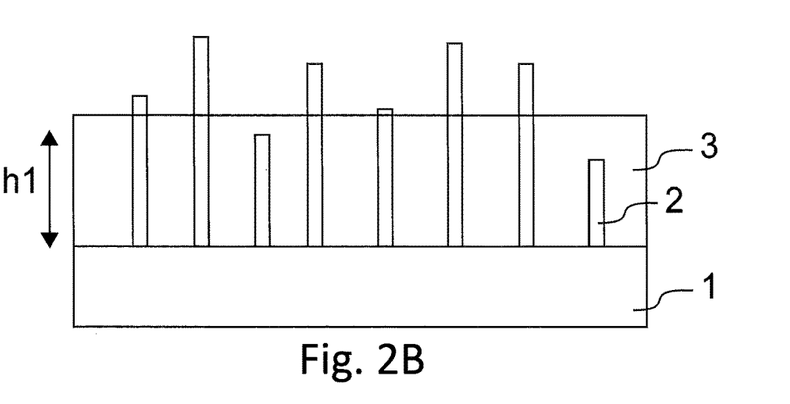
Figure 2C:
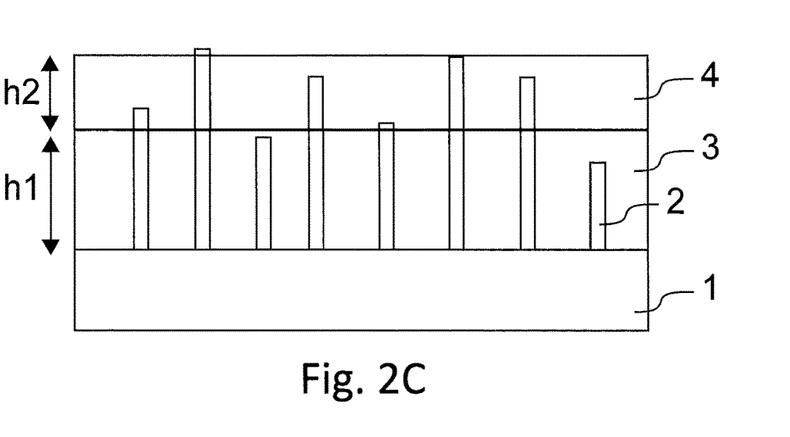
Figure 2D:
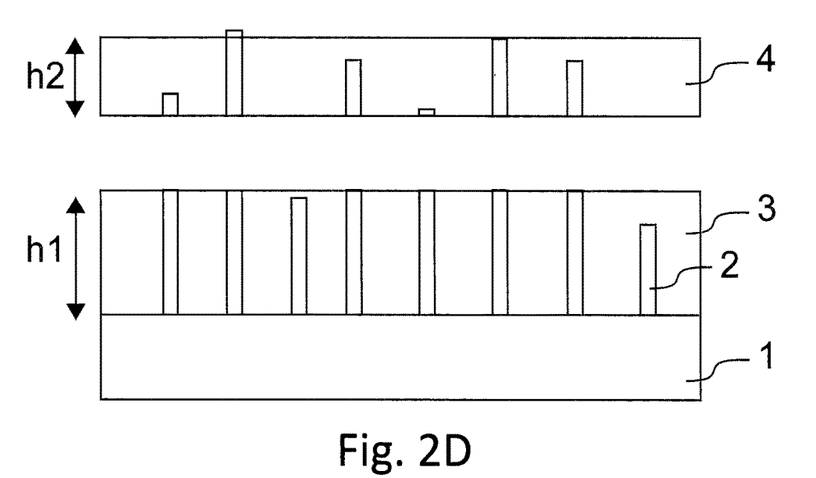
Figure 2E:
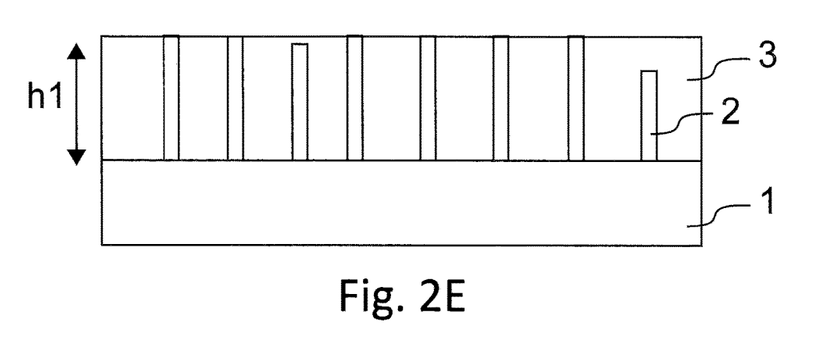

Further, a mechanical stress is exerted during the removing step E3 between the first film 3 and the second film 4. As previously explained, this mechanical stress will enable the wires to be broken at the interface between the first film 3 and the second film 4. Thus, the part of the wires 2 which is contained in the second film 4 will be removed at the same time as the second film 4 as illustrated in FIG. 2D. Thus, a plurality of wires 2 the height of which does not exceed the first height h1 is obtained as illustrated in FIG. 2E. In an embodiment, this mechanical stress is ensured by performing removal of the second film for example by peeling, shearing or even tearing.

The plurality of wires 2 erected on the substrate 1 can be obtained by growth. The substrate 1 can be a silicon (Si), sapphire ($Al_2IO_3$) or even gallium nitride (GaN) substrate depending on the type of wires desired to be grown. The wires can be made, depending on the contemplated application, of a material comprising zinc oxide (ZnO), Si, gallium arsenide (GaAs), carbon (C), GaN or more generally semiconductors belonging to families II-VI or III-V. The growth technique can be chosen from a MOVPE (Metalorganic Vapour Phase Epitaxy), hydrothermal growth, MBE (Molecular Beam Epitaxy) or even HVPE (Hydride Vapour Phase Epitaxy) technique. These growth techniques enable a very high crystal quality to be obtained. Of course, other techniques are also contemplatable.

Alternatively or complementarily, the wires can be obtained by coating or any other method enabling an elongate structure to be obtained, as extrusion, mechanical assembly, etching or even phase separation. More generally, any method enabling an elongate structure to be obtained can be used. The wires can have a milliscale, microscale or even nanoscale size. Wires with a milliscale size will for example be beneficial in high frequency applications, in particular for making antennas and absorbers.

Figure 3:
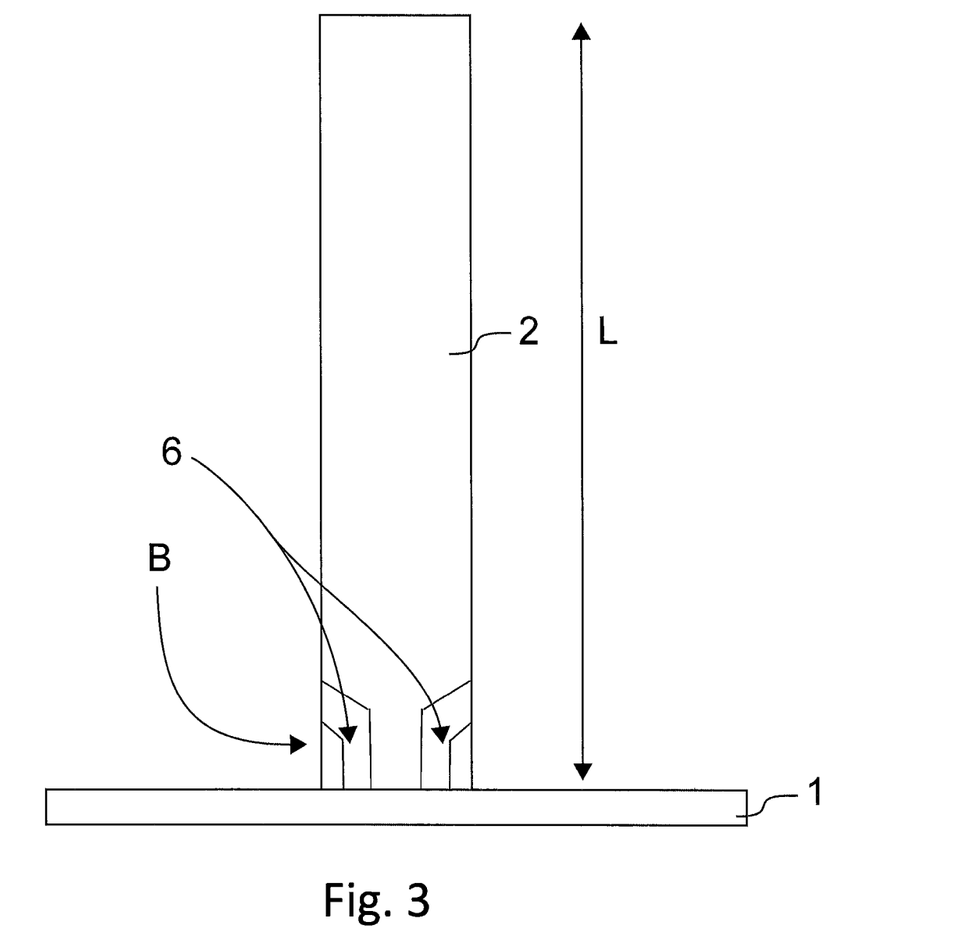
FIG. 3 illustrates the formation of dislocations in the base of a wire.

In an embodiment, the initial length L of the wires is between 10 μm and 700 μm. Indeed, as illustrated for example in FIG. 3 in the case of a wire heteroepitaxy on a substrate with a lattice mismatch, when the wires are grown, these dislocations 6 are formed at the base B of the wire. These dislocations 6 generally extend over a maximum length of the same order of magnitude as the diameter of the wire from the base and are detrimental to the crystal quality. It is thus desirable to choose an initial length L of the wires which is large given the extent of the dislocations.

In an embodiment, the material used for the first film 3 and/or the second film 4 can be chosen from PDMS, parylene, PEN, PVN, PVDF or a combination of these materials.

In an embodiment, the first film 3 and/or the second film 4 are coated using one or more spin coatings. In an embodiment, the first film 3 is made of a first material, the second film 4 is made of a second material.

The separation between both materials is mainly governed by their mechanical and/or chemical properties. In choosing these materials, it is thereby desirable to favor materials having different Young or shearing modules and/or materials having a small adhesion energy. In other words, the choice of the materials results from a compromise between the previously discussed parameters and the force to apply upon removing the different films.

Alternatively or complementarily, it is possible to use different coating conditions, times and/or annealing temperatures for the first film 3 and the second film 4, for example to define a different polymerization degree between the materials making up the films.

Figure 4A:
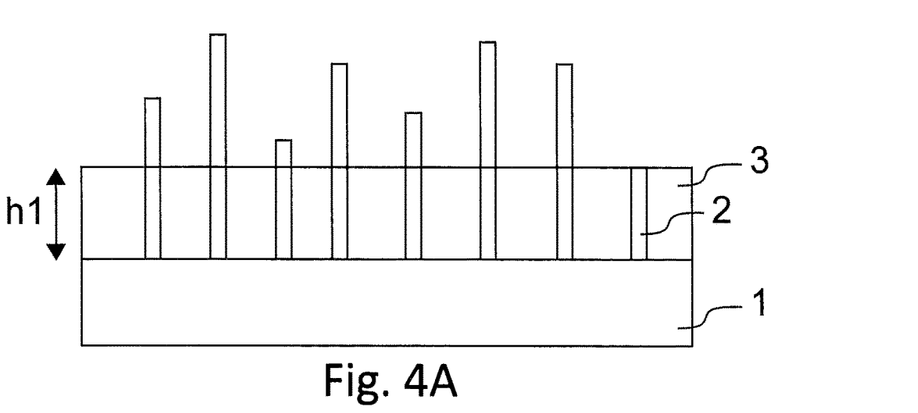
FIGS. 4A and 4B show two steps of an alternative of the first embodiment of a method according to a first aspect of the invention.
Figure 4B:
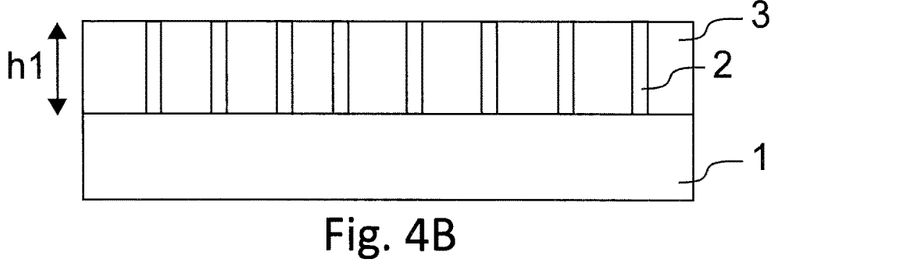
Figure 5:
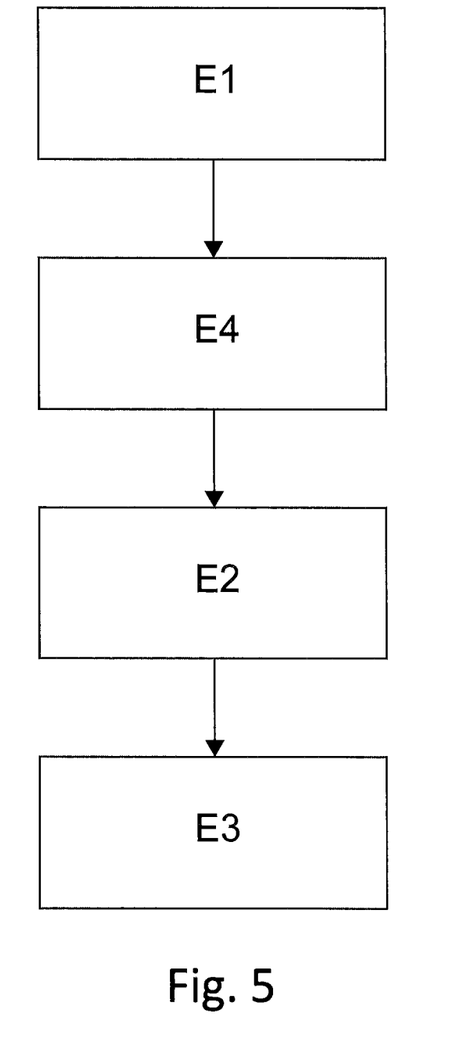
FIG. 5 shows a flowchart of a second embodiment of a method according to a first aspect of the invention.

In an embodiment illustrated in FIGS. 4A and 4B, the first height h1 of the first film 3 is chosen so as to be smaller than or equal to the height of the lowest wire (illustrated in FIG. 4A). The homogeneity of the final structure is thereby optimal since, at the end of the removal step E3, all the wires 2 have a height substantially equal to the first height h1 (illustrated in FIG. 4B), in other words, being smaller than or equal to the height of the shortest wire from the wires of the plurality of wires.

A second embodiment of a homogenizing method according to a first aspect of the invention is illustrated in FIGS. 5 and 6A to 6E. In this embodiment, in the same way as in the first embodiment, there is first a substrate 1 comprising a plurality of wires 2 erected on one of its faces. Besides, the method comprises:
 a first step E1 of coating (illustrated in FIG. 6B) the face of the substrate 1 comprising the plurality of wires 2 with a first film 3, the first film 3 embedding the plurality of wires 2 over a first height h1;
 a third step E4 of coating (illustrated in FIG. 6C) with an anti-adhesive layer 5;
 a second step E2 of coating (illustrated in FIG. 6D) the first film 3 with a second film 4, the second film 4 embedding the plurality of wires 2 over a second height h2;
 a step E3 of removing (illustrated in FIG. 6E) the second film 4, the part of the wires 2 of the plurality of wires 2 embedded in the second film 4 being removed at the same time as the second film 4.

Figure 6A:
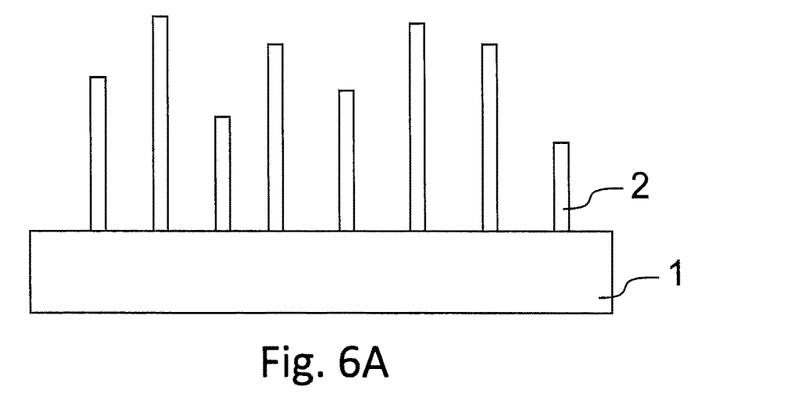
FIGS. 6A to 6E show the different steps of the second embodiment of a method according to a first aspect of the invention.
Figure 6B:
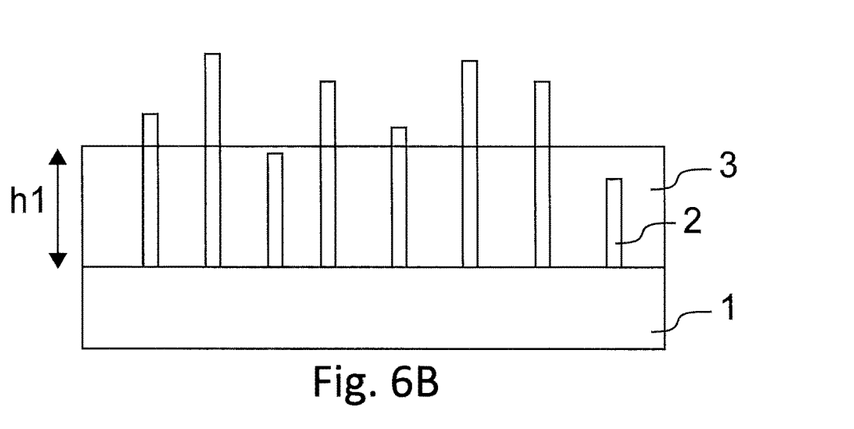
Figure 6C:
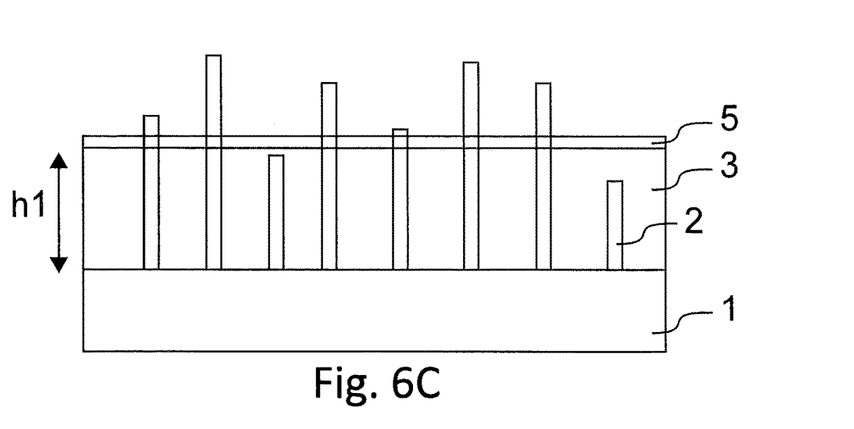
Figure 6D:
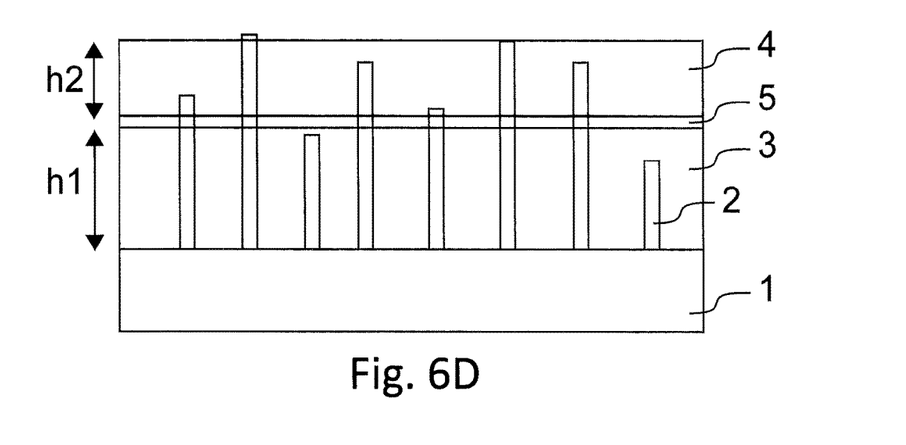
Figure 6E:
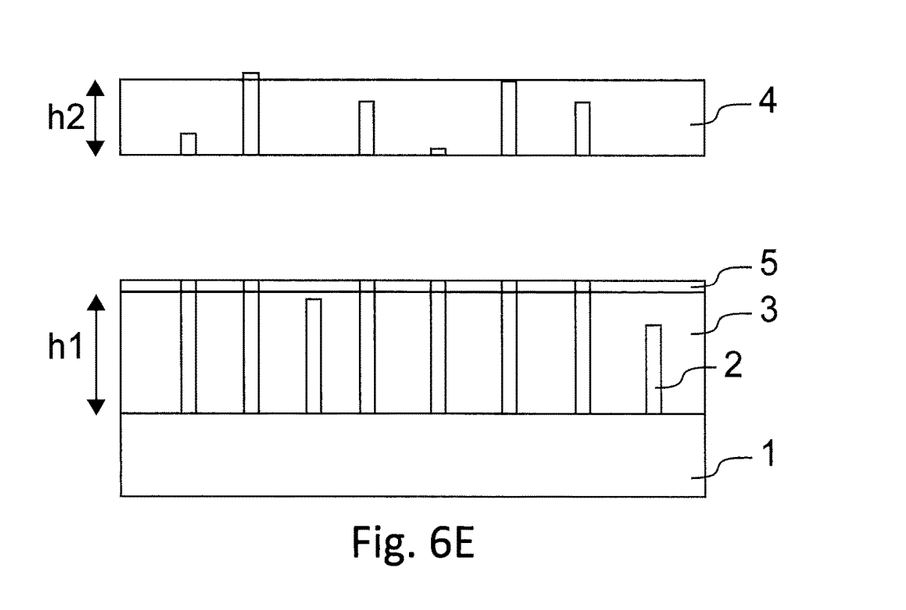

In an embodiment, the adhesion energy between the anti-adhesive layer 5 and the first film 3 is higher than the adhesion energy between the anti-adhesive layer 5 and the second film 4. As illustrated in FIG. 6E, the anti-adhesive layer 5 thereby remains at least partially integral with the first film 3 during step E3 of removing the second film 4 and the mechanical stress will thus be exerted on the wires at the interface between the anti-adhesive layer 5 and the second film 4. As illustrated in FIG. 6E, the substrate thereby includes at the end of step E3 of removing the second film, the first film 3 and the anti-adhesive layer 5.

Figure 7A:
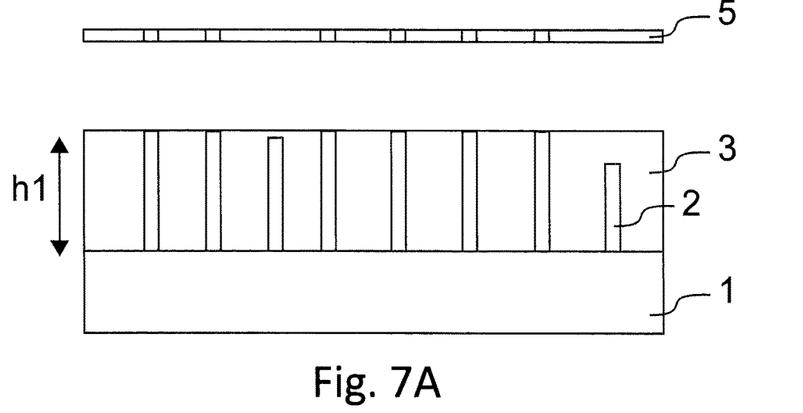
FIGS. 7A and 7B show two steps of an alternative of the second embodiment of a method according to a first aspect of the invention.
Figure 7B:
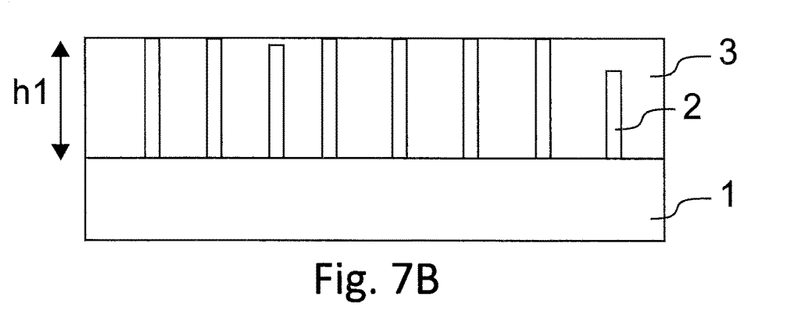

In an embodiment illustrated in FIGS. 7A and 7B, the method can also comprise, after step E3 of removing the second film 4, a step of removing the anti-adhesive layer 5, the substrate including at the end of this step the first film 3. This removal step can be made by selective etching, peeling if the thickness of the anti-adhesive layer 5 is sufficient or adhesive evaporation (in this case, the end of the wires projects from the film 3 by a height equal to the thickness of the evaporated anti-adhesive layer 5).

In an alternative embodiment, the adhesion energy between the anti-adhesive layer 5 and the first film 3 is less significant than the adhesion energy between the anti-adhesive layer 5 and the second film 4. In this embodiment, the anti-adhesive layer 5 remains integral with the second film 4 during the removal step E3 of the second film 4. The anti-adhesive layer 5 is thus removed at the same time as the second film 4.

In both these embodiments, the anti-adhesive layer 5 enables the removal step E3 between the first film 3 and the second film 4 to be facilitated. Generally, the thickness of the anti-adhesive layer 5 is small in comparison with the first height h1 such that the presence of the anti-adhesive layer 5 has only a negligible influence on the height of the wires 2 obtained at the end of the method. In other words, the maximum height of the wires 2 obtained at the end of step E3 of removing the second film 4 is substantially equal to the first height h1. In an embodiment, the anti-adhesive layer is made using TFCOS (tridecafluorotetrahydrooctyltrichlorosilane), PFDTS (perfluorodecyltriethoxysilane) or even HPMC (hydroxypropylmethylcellulose).

Figure 8A:
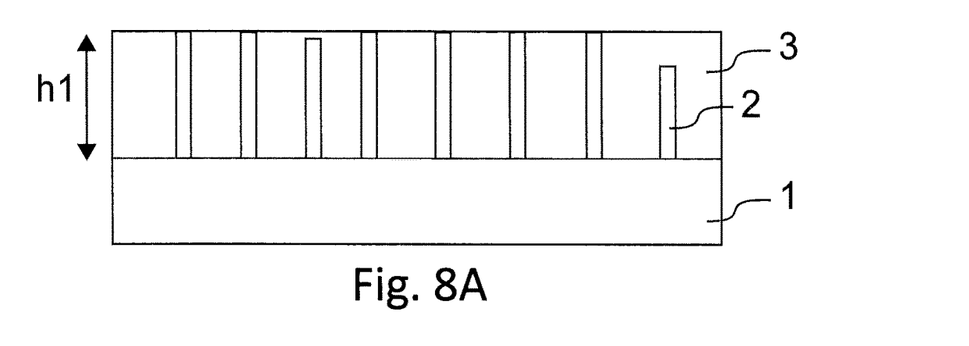
FIGS. 8A and 8B show two steps of an alternative of the first or the second embodiment of a method according to a first aspect of the invention.
Figure 8B:
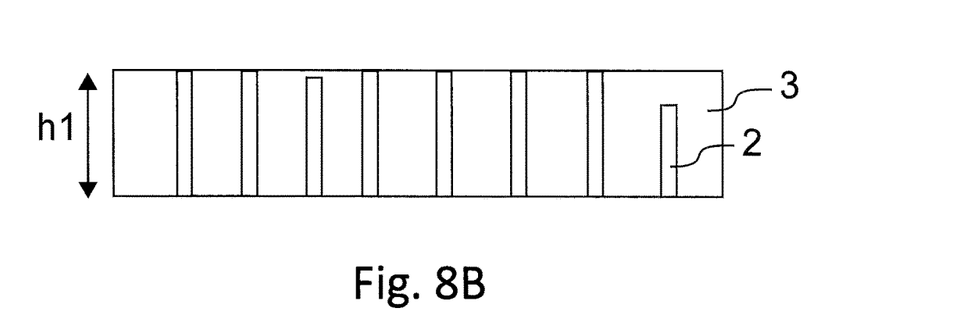

In an embodiment illustrated in FIGS. 8A and 8B, the method according to a first aspect of the invention includes, after step E3 of removing the second film 4 or the step of removing the anti-adhesive layer 5, a step of removing the substrate 1. The latter step enables a membrane the thickness of which is equal to the first height h1 to be obtained and that includes wires 2 with a homogeneous height.

Figure 9A:
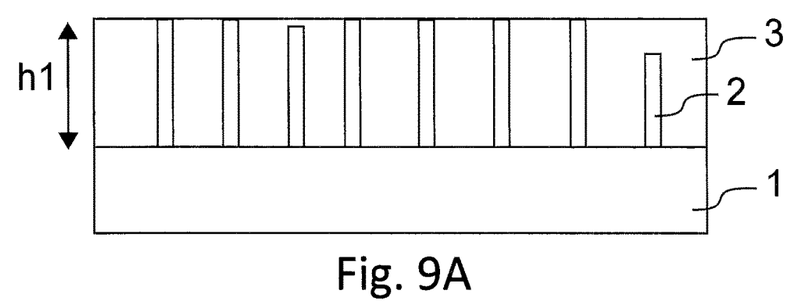
FIGS. 9A and 9B show two steps of an alternative of the first or the second embodiment of a method according to a first aspect of the invention.
Figure 9B:
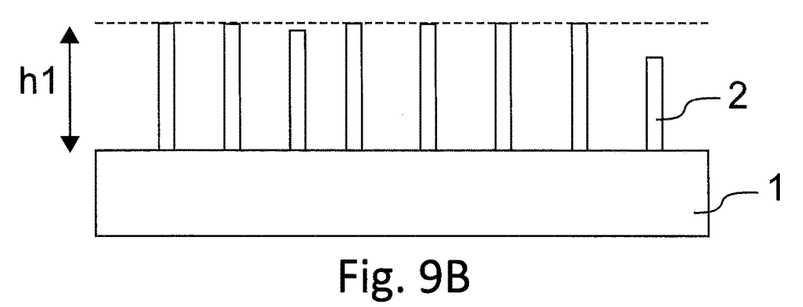

Alternatively, as illustrated in FIGS. 9A and 9B, the method according to a first aspect of the invention includes, after step E3 of removing the second film 4 or the step of removing the anti-adhesive layer 5, a step of removing the first film 3, for example by chemical dissolution or ionic etching. The latter step enables the substrate 1 at the surface of which wires 2 with a homogeneous height are located to be obtained.

In all of these embodiments, only two films coat the substrate. However, it is possible to contemplate the use of a plurality of films, this plurality of films enabling, as has been previously shown, a plurality of membranes each including a plurality of wires with a homogeneous height to be obtained. For that, in another embodiment, the method includes a step of coating with a plurality of films, each film being possibly separated by an anti-adhesive layer, the surface of the substrate including the plurality of erected wires, the plurality of films embedding at least partly the plurality of erected wires. The method also comprises a step of removing the plurality of films, this removal step enabling the different films coated during the step of coating with the plurality of films to be removed one by one, for example by peeling. Thus, a plurality of membranes each including a plurality of wires with a homogeneous height is obtained.

The plurality of wires obtained by the method according to a first aspect of the invention can then be used in manufacturing electronic devices. In order to understand the benefit provided by the use of this plurality of wires 2 in an electronic device, this use will be illustrated through two examples of device: a piezoelectric sensor and a light emitting device. However, these are only examples of use which limit in no way the present invention but aim at illustrating some of the previously discussed benefits. Indeed, it is also possible to contemplate the use of such a plurality in many devices such as pressure sensors or nano-generators for example.

Figure 10A:
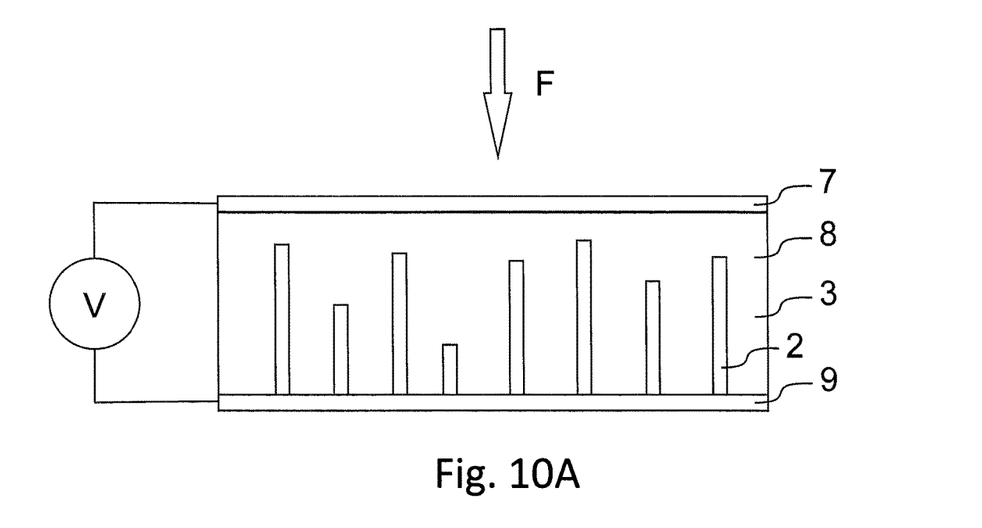
FIG. 10A shows a piezoelectric sensor of prior art.

FIG. 10A illustrates a piezoelectric sensor with wires according to the state of the art. In this device, a plurality of wires 2 is located between a first electrode 7 and a second electrode 9, the wires 2 being only in electrical contact with the second electrode 9. When a force F is applied at the first electrode 7, the latter will be deformed and generate a stress on the wires 2. As a result, there is a modification in the voltage across the structure which enables the deformation to be characterized. Such a device can for example be used in a pressure sensor. However, in a sensor according to the state of the art, the wires 2 which are used are not always homogeneous which is detrimental to measurement accuracy, a same deformation not having the same influence depending on its location.

Figure 10B:
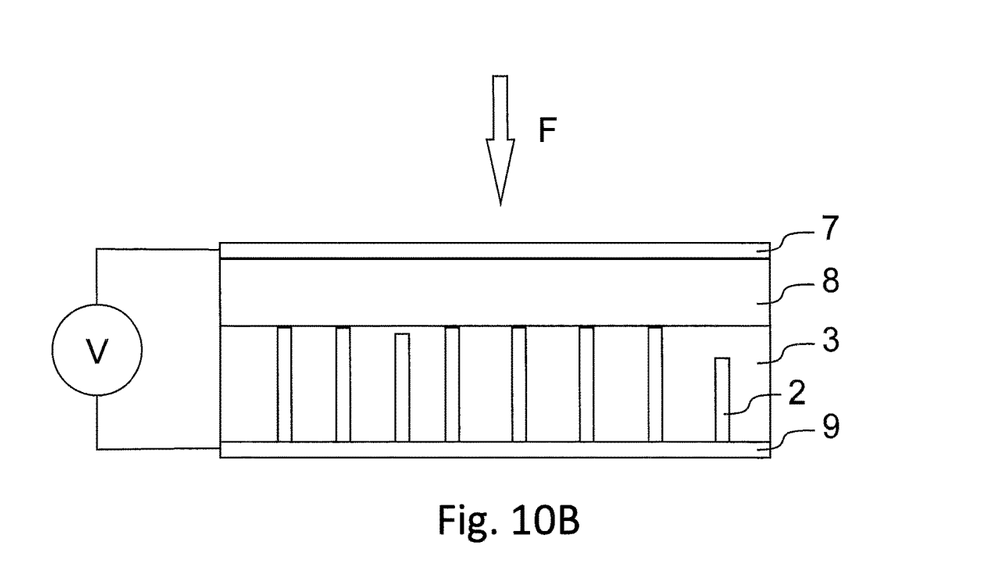
FIG. 10B shows a piezoelectric sensor according to a first embodiment of a second aspect of the invention.

A sensor according to a first embodiment of a second aspect of the invention aiming at solving this problem is illustrated in FIG. 10B. In this embodiment, the wires 2 are obtained using a method according to a first aspect of the invention and thus have a proper homogeneity in their height. As a result, there is a more accurate sensor. Moreover, when the desired accuracy requires an identical height for all of the wires 2, it is possible to choose a first height h1 of the first film 3 which is smaller than or equal to the height of the lowest wire 2. Thereby, as has been illustrated previously, wires 2 with an identical height and thus a sensor with a great accuracy as well as a smaller distribution in the electrical characteristics between the different manufactured sensors are achieved.

Figure 11A:
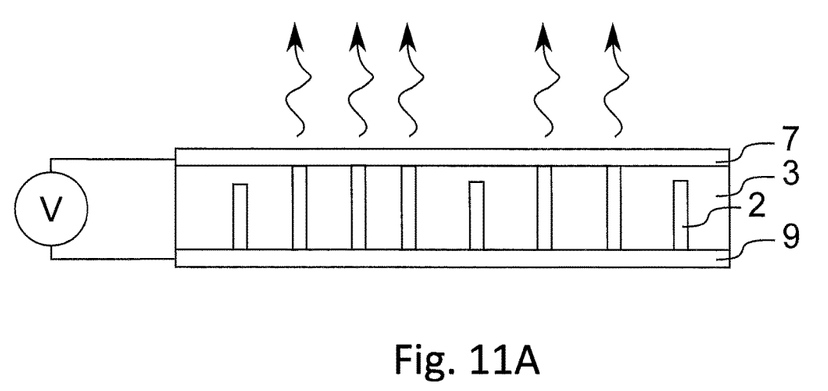
FIG. 11A shows a light emitting device of prior art.

FIG. 11A illustrates a light emitting device according to the state of the art. In such a device, a plurality of wires is inserted between a first electrode 7 and a second electrode 9. In order to be able to generate light, it is necessary that a current passes through the wires 2 and thus that the latter are electrically connected to the first electrode 7 and the second electrode 9. However, because of the inhomogeneity of the heights of the wires 2, it is very difficult to obtain a device in which all of the wires 2 are connected this way. That results in an inhomogeneous light, the latter being only emitted by the wires 2 connected to the first electrode 7 and to the second electrode 9 as is illustrated in FIG. 11A.

Figure 11B:
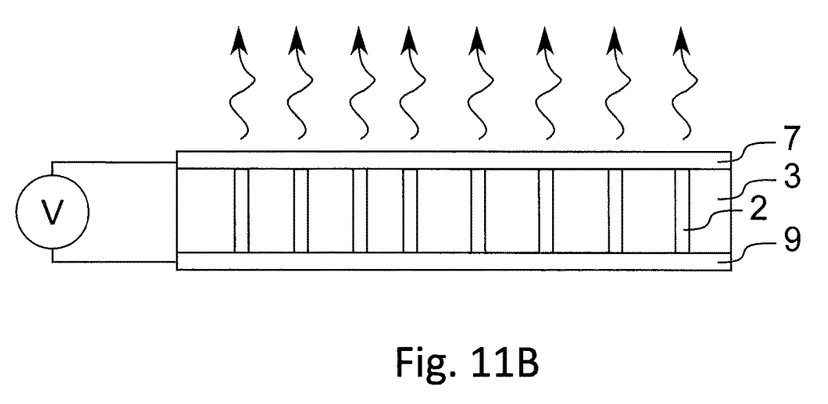
FIG. 11B shows a light emitting device according to a second embodiment of a second aspect of the invention.

A light emitting device according to a second embodiment of a second aspect of the invention is illustrated in FIG. 11B. In this embodiment, the wires 2 are obtained using a method according to a first aspect of the invention. The wires thus have a proper homogeneity in their height and consequently the distribution of the wires connected to the first electrode 7 and to the second electrode 9 in the light emitting device is better than that of the devices of the state of the art. That results in a light emitting device in which the current density is more homogeneous and thus producing a spectrally more homogeneous light. Furthermore, in addition to ensuring a proper homogeneity in the height of the wires, using a method according to a first aspect of the invention enables a step of suppressing the ends of the wires to be dispensed with upon making devices including the wires. Indeed, it is often necessary to remove these ends because they can have electrical properties that can be troublesome for the device to properly operate. But, the upper part of the wires is withdrawn upon manufacturing the plurality of wires, in particular during the film removal step in which the upper part is embedded. In this embodiment, it could for example be chosen to grow GaN wires having a core-shell type structure.

The invention claimed is:

1. A method for homogenizing a height of a plurality of wires from the plurality of wires erected on a face of a substrate, the method comprising:
    a first step of coating the face of the substrate comprising the plurality of wires with a first film, said first film embedding the plurality of wires over a first height;
    a second step of coating the first film with a second film, said second film embedding at least one part of the plurality of wires over a second height;
    a step of removing the second film, the part of the wires of the plurality of wires embedded in the second film being removed at the same time as said second film;
    a mechanical stress between the first film and the second film being exerted during the removal step.

2. The method according to claim 1, wherein said first height is smaller than or equal to the height of the lowest wire from the wires of the plurality of wires.

3. The method according to claim 1, further comprising, between the first coating step and the second coating step, a third step of coating with an anti-adhesive layer.

4. The method according to claim 3, further comprising after the step of removing the second film and when the anti-adhesive layer has remained at least partially on the first film, a step of removing the anti-adhesive layer.

5. The method according to claim 4, further comprising, after the step of removing the second film or the step of removing the anti-adhesive layer, a step of removing the substrate, the first film thereby forming a membrane including a plurality of wires with a homogeneous height.

6. The method according to claim 4, further comprising, after the step of removing the second film or the step of removing the anti-adhesive layer, a step of removing the first film.

7. A method for manufacturing an electronic or optoelectronic device including a plurality of wires, the method comprising a step of manufacturing a plurality of wires with a homogeneous height, wherein said step of manufacturing a plurality of wires with a homogeneous height implements a method according to claim 1.

* * * * *